(12) United States Patent
Gu et al.

(10) Patent No.: US 12,213,330 B2
(45) Date of Patent: Jan. 28, 2025

(54) PRECURSOR SOLUTION, A PEROVSKITE SOLAR CELL AND A PREPARATION METHOD THEREOF

(71) Applicant: EAST CHINA UNIVERSITY OF SCIENCE AND TECHNOLOGY, Shanghai (CN)

(72) Inventors: Shuai Gu, Shanghai (CN); Lei Xing, Shanghai (CN); Jianguo Yu, Shanghai (CN)

(73) Assignee: East China University of Science and Technology, Shanghai (CN)

( * ) Notice: Subject to any disclaimer, the term of this patent is extended or adjusted under 35 U.S.C. 154(b) by 421 days.

(21) Appl. No.: 17/630,356

(22) PCT Filed: Apr. 28, 2021

(86) PCT No.: PCT/CN2021/090599
§ 371 (c)(1),
(2) Date: Jan. 26, 2022

(87) PCT Pub. No.: WO2022/183582
PCT Pub. Date: Sep. 9, 2022

(65) Prior Publication Data
US 2023/0086554 A1 Mar. 23, 2023

(30) Foreign Application Priority Data

Mar. 5, 2021 (CN) .......................... 202110243903.2

(51) Int. Cl.
*H10K 30/88* (2023.01)
*C09K 11/02* (2006.01)
(Continued)

(52) U.S. Cl.
CPC .............. *H10K 30/88* (2023.02); *C09K 11/02* (2013.01); *C09K 11/0827* (2013.01); *H10K 71/00* (2023.02)

(58) Field of Classification Search
CPC ........ H10K 30/88; H10K 71/00; H10K 30/50; H10K 71/12; H10K 30/20; H10K 85/50;
(Continued)

(56) References Cited

U.S. PATENT DOCUMENTS

| 7,960,901 | B2* | 6/2011 | Natori ................... C04B 35/493 |
| | | | 252/62.9 PZ |
| 10,388,224 | B2* | 8/2019 | Kim ..................... H10K 50/115 |
| 10,416,555 | B2* | 9/2019 | Wuister ............... G03F 7/0047 |
| 11,396,627 | B2* | 7/2022 | Han ..................... C09K 11/664 |

(Continued)

FOREIGN PATENT DOCUMENTS

| CN | 105609645 A | 5/2016 |
| CN | 110902715 A | 3/2020 |

OTHER PUBLICATIONS

"International Search Report and Written Opinion corresponding International Application No. PCT/CN2021/090599 mailed Dec. 6, 2021".

*Primary Examiner* — Caleb E Henry
(74) *Attorney, Agent, or Firm* — Myers Bigel, P.A.

(57) ABSTRACT

The disclosure provides a precursor solution, a perovskite solar cell and a preparation method thereof. The solute of the precursor solution includes a metal halide, the solvent of the precursor solution is an organic solvent, and the precursor solution contains nanobubbles, which have a diameter not more than 1000 nm, and the zeta potential of the precursor solution does not exceed-20 mV. The method of preparing the precursor solution includes: (1) preparing an organic solvent containing nanobubbles; (2) dissolving a solute in the organic solvent containing nanobubbles. The precursor solution of the disclosure has a very low zeta potential, and the nanobubbles can exist stably in the organic solvent(s) for (Continued)

up to one month. When comparing with traditional methods for preparing the precursor solution of the perovskite cells, the method for preparing the precursor solution of the disclosure can effectively improve the stability, reproducibility and solubility of the metal halide in the organic solvent(s).

10 Claims, 4 Drawing Sheets

(51) Int. Cl.
  *C09K 11/08* (2006.01)
  *H10K 71/00* (2023.01)

(58) Field of Classification Search
  CPC ........ H10K 71/15; H10K 85/30; C09K 11/02; C09K 11/0827; Y02E 10/549
  See application file for complete search history.

(56) References Cited

U.S. PATENT DOCUMENTS

| | | | |
|---|---|---|---|
| 2005/0019493 A1* | 1/2005 | Basceri | H01L 21/02271 427/79 |
| 2009/0230821 A1* | 9/2009 | Natori | C04B 35/497 310/358 |
| 2010/0207492 A1* | 8/2010 | Natori | C23C 18/1225 310/365 |
| 2010/0289384 A1* | 11/2010 | Natori | H10N 30/078 310/367 |
| 2011/0275163 A1* | 11/2011 | Ahn | H01L 21/02197 257/E43.006 |
| 2012/0295099 A1* | 11/2012 | Watanabe | B05D 5/00 427/126.3 |
| 2017/0233645 A1* | 8/2017 | Zhong | C09K 11/06 252/301.16 |
| 2020/0051752 A1* | 2/2020 | Beaumont | H01L 31/032 |
| 2020/0270141 A1* | 8/2020 | Gao | H10K 50/115 |
| 2022/0177719 A1* | 6/2022 | Doherty | C09D 11/322 |
| 2022/0194969 A1* | 6/2022 | Lee | C09K 11/02 |
| 2022/0392929 A1* | 12/2022 | Zhang | H10K 85/50 |
| 2024/0117208 A1* | 4/2024 | Yakimov | C09K 11/7706 |

* cited by examiner

PRECURSOR SOLUTION, A PEROVSKITE SOLAR CELL AND A PREPARATION METHOD THEREOF

STATEMENT OF PRIORITY

This application is a 35 U.S.C. § 371 national phase application of PCT Application PCT/CN2021/090599 filed Apr. 28, 2021, which claims priority to Chinese Application No. 202110243903.2, filed on Mar. 5, 2021, the entire contents of each of which are incorporated by reference herein in its entirety.

TECHNICAL FIELD

The invention relates to the technical field of chemical materials, in particular to a precursor solution, a perovskite solar cell and a preparation method thereof.

BACKGROUND

Perovskite materials refer to a class of materials that meet the stoichiometric ratio of $ABX_3$ and have a perovskite crystal structure. Perovskite composite material is a new type of organic-inorganic metal halide with unique physical and chemical properties. It can be used in many fields such as solid fuel cells, solid electrolytes, sensors, high-temperature heating materials, solid resistors, and be used in redox catalyst to replace precious metals. Perovskite materials are a research hotspot in interdisciplinary subjects such as chemistry, physics and materials.

A solar cell is a device that directly converts light energy into electrical energy through the photoelectric effect or photochemical reaction. In 1839, French physicist Becquerel discovered the photovoltaic effect. In 1876, British scientist Adams and others discovered that when sunlight irradiates a selenium semiconductor, an electric current is generated. The working principle of the photoelectric effect solar cell is that sunlight shines on the p-n junction of a semiconductor to form a new hole-electron pair, and electrons and holes move to both sides of the junction under the effect of the p-n junction electric field to form an additional potential difference.

A perovskite solar cell generally consists of a transparent conductive substrate, a carrier transport layer, a perovskite layer, and a metal electrode. The perovskite layer absorbs photons to generate electron-hole pairs. Because the exciton binding energy of the perovskite materials is very small, it can be separated into free carriers at room temperature, and the free carriers generated subsequently are respectively transmitted out by the materials of the transport layer, then collected by the electrodes to form a current which then applies work in an external circuit, thereby completing the entire photoelectric conversion process. The perovskite-based solar cells based on the structure of $ABX_3$ have great potential for development.

Organic-inorganic hybrid perovskite solar cell, as an emerging thin-film solar cell, has attracted widespread attention since its first appearance in 2009, although its photoelectric conversion efficiency was only 3.8% at that time. However, due to many advantages of the organic-inorganic hybrid perovskite material (for example, CH3NH3PbX3 (X=I, Br, Cl)) as a light absorption layer, such as high absorption coefficient, high carrier mobility, and long carrier transport distance, processable in solution, low cost and the like, a series of studies and improvement on the cells have been carried out in afterwards. Efficient and stable perovskite absorber layer materials are crucial to the stability and photoelectric conversion efficiency of perovskite cells, and can effectively increase the service life of perovskite solar cells.

For example, one preparation process of traditional perovskite cell precursor solution is that adding an appropriate amount of $PbI_2$ directly to an organic solvent (DMF, DMSO, acetonitrile, etc. and their mixed solutions), then stirring, and subsequently applying it onto a substrate of FTO (fluorine-doped Tin Oxide)/ITO (Indium Tin Oxide). However, for example, the solubility of $PbI_2$ in organic solvents is limited. After being affected by environment, it is easy to be combined and transformed into lead iodide crystals from an ionic state, which will ultimately affect the stability and photoelectric conversion efficiency of the perovskite cells.

SUMMARY

In view of the problems existing in the prior art, one aspect of the disclosure is to provide a precursor solution. Specifically, one aspect of the disclosure is to provide a stable precursor solution with abundant nanobubbles (NB or NBs), which can remain stable for a long period of time. Further, one aspect of the disclosure is to provide a use of the precursor solution for preparing the absorption layer of a perovskite solar cell.

Another aspect of the disclosure is to provide a method for preparing the precursor solution.

Further, yet another aspect of the disclosure is to provide a perovskite absorption layer. Further, yet another aspect of the disclosure is to provide a use of the perovskite absorber layer for preparing a perovskite solar cell.

Further, another aspect of the disclosure is to provide a method for preparing a perovskite absorption layer.

Furthermore, yet another aspect of the disclosure is to provide a perovskite solar cell.

Furthermore, another aspect of the disclosure is to provide a method for preparing a perovskite solar cell.

One of the aspects of the disclosure is to prepare a stable precursor solution of the perovskite solar cell. When comparing with the conventional method which is directly dissolving metal halides (such as $PbI_2$) in an organic solvent, the stability of the precursor solution prepared by the method of the disclosure is significantly improved, and the solubility of the metal halides (such as $PbI_2$) (under the case that other conditions (such as temperature, humidity and solvent type) are the same) is significantly increased, therefore a solar cell device prepared by said precursor solution, both the efficiency and the reproducibility of the device are greatly improved.

The following technical solution is adopted by the disclosure:

In a specific embodiment, the disclosure provides a precursor solution, the solute of the precursor solution comprises a metal halide, the solvent of the precursor solution is an organic solvent, and the precursor solution contains nanobubbles, wherein the diameter of the nanobubbles is not more than 1000 nm, for example, such as not more than 900 nm, 800 nm, 700 nm, 500 nm, 400 nm, 300 nm, or 200 nm. In a preferred embodiment, it is, for example, in a range from 1 nm to 200 nm, such as in a range from 10 nm to 200 nm, from 50 nm to 200 nm, from 60 nm to 190 nm, from 60 nm to 180 nm, from 60 nm to 170 nm, from 60 nm to 160 nm, from 60 nm to 150 nm, from 60 nm to 140 nm, from 60 nm to 130 nm, from 60 nm to 120 nm, from 70 nm to 120 nm, from 80 nm to 120 nm, from 90 nm to 120 nm, from 80 nm to 110 nm, such as, for example is about 120 nm, about 110 nm, about 100 nm, about 90 nm, about 80 nm.

The term "zeta potential" as used herein refers to the potential at the slipping plane, also called electrokinetic electric potential or electrokinetic potential (ξ-electric potential or (ξ-potential). The absolute value of the zeta potential (positive or negative) is higher, the system is more stable, which means dissolution or dispersion can resist aggregation. Conversely, the absolute value of the zeta potential (positive or negative) is lower, the particles are more prone to be agglomerated or aggregated.

Among them, the zeta potential of the precursor solution is not more than −20 mV, such as not more than −25 mV, not more than −30 mV, not more than −35 mV, not more than −40 mV. Optionally, the zeta potential of the precursor solution is in a range from −90 mV to −20 mV, preferably from −80 mV to −20 mV, preferably from −70 mV to −20 mV, preferably from −90 m V to −30 mV, preferably from −80 mV to −30 mV, preferably from −70 mV to −30 mV. As an example, the zeta potential of the precursor solution is about −21 mV, about −22 mV, about −23 mV, about −24 mV, about −25 mV, about −26 mV, about −27 mV, about −28 mV, about −29 mV, about −30 mV, about −31 mV, about −32 mV, about −33 mV, about −34 mV, about −35 mV, about −36 mV, about −37 mV, about −38 mV, about −39 mV, about −40 mV, about −41 mV, about −42 mV, about −43 mV, about −44 mV, about −45 mV, about −46 mV, about −47 mV, about −48 mV, about −49 mV, about −50 mV, about −51 mV, about −52 mV, about −53 mV, about −54 mV, about −55 mV, about −56 mV, about −57 mV, about −58 mV, about −59 mV, about −60 mV, about −61 mV, about −62 mV, about −63 mV, about −64 mV, about −65 mV, about −66 mV, about −67 mV, about −68 mV, about −69 mV, or about −70 mV.

As used herein, the term "precursor" is an existing form occurred before obtaining the target product, or an intermediate product, or refers to a prototype sample of the target product, which is a forerun product that can be transformed into the target product after certain steps.

As an example, the halogen element in a metal halide can be F, I, Br, or Cl. For example, the metal halide can be, for example, a metal iodide, which is a compound having the anion of an iodide ion bound with the cation of a metal ion, such as lead iodide or tin iodide; or, for example, a metal chloride, which is a compound having the anion of a chloride ion bound with the cation of a metal ion, such as lead chloride or tin chloride.

In various embodiments, the metal halide includes at least one of lead halide, tin halide, indium halide, silver halide, antimony halide, bismuth halide, lithium halide, beryllium halide, sodium halide, magnesium halide, aluminum halide, potassium halide, calcium halide, scandium halide, titanium halide, vanadium halide, chromium halide, manganese halide, iron halide, cobalt halide, nickel halide, copper halide, zinc halide, gallium halide, germanium halide, rubidium halide, strontium halide, yttrium halide, zirconium halide, niobium halide, molybdenum halide, technetium halide, ruthenium halide, rhodium halide, palladium halide, cadmium halide, cesium halide, barium halide, lanthanide halide, hafnium halide, tantalum halide, tungsten halide, rhenium halide, osmium halide, iridium halide, platinum halide, gold halide, mercury halide, thallium halide, polonium halide, actinium halide, or a mixture of two or more of the above compounds, in which the halogen element may be, for example, iodine or chlorine.

In a preferred embodiment, the metal halide includes at least one of lead halide, tin halide, indium halide, silver halide, antimony halide, and bismuth halide. As an example, but not for a special limitation, the metal halide may be, for example, $PbI_2$, $SnI_4$, $SnI_2$, $SnCl_4$, $SnCl_2$, $InI_3$, AgF, AgCl, AgBr, AgI, $SbI_3$, $BiI_3$.

In various embodiments, the organic solvent includes at least one of an aromatic hydrocarbon-based organic solvent, an aliphatic hydrocarbon-based organic solvent, an alicyclic hydrocarbon-based organic solvent, a halogenated hydrocarbon-based organic solvent, an alcohol-based organic solvent, an ether-based organic solvent, an ester-based organic solvents, a ketone-based organic solvent, a pyridine-based organic solvent, a phenol-based organic solvent, a nitrile-based organic solvent, and a sulfone-based organic solvent.

As an example, but not for a special limitation, the organic solvent may be at least one of the following: acetonitrile, N,N-dimethylformamide, dimethyl sulfoxide, benzene, toluene, xylene, pentane, hexane, octane, cyclohexane, cyclohexanone, toluene/cyclohexane, chlorobenzene, dichlorobenzene, dichloromethane, methanol, ethanol, 1-propanol, 2-propanol, 1-butanol, 2-butanol, pentanol, ethyl ether, propylene oxide, methyl acetate, ethyl acetate, propyl acetate, isobutyl acetate, acetone, methyl butanone, methyl isobutyl ketone, ethylene glycol monomethyl ether, ethylene glycol monoethyl ether, ethylene glycol monobutyl ether, pyridine, phenol, styrene, perchloroethylene, trichloroethylene, ethylene glycol ether, and triethanolamine. As a preferred embodiment, the organic solvent may be at least one of the following: acetonitrile, N,N-dimethylformamide (DMF), dimethyl sulfoxide (DMSO), and acetone.

In various embodiments, the solubility of the solute in the organic solvent containing (or doped with) nanobubbles is higher than the solubility of the solute in the organic solvent not containing nanobubbles. Under other conditions (such as temperature, humidity, type of solvents) unchanged, the solubility of the solute in organic solvents containing (or doped with) nanobubbles is higher than that of without nanobubbles for at least 5%, at least 6%, at least 7%, at least 8%, at least 9%, at least 10%, at least 11%, at least 12%, at least 13%, at least 14%, at least 15%; at least 16%, At least 17%, at least 18%, at least 19%, at least 20%, at least 21%, at least 22%, at least 23%, at least 24%, at least 25%, at least 26%, at least 27%, at least 28%, at least 29%, at least 30%, at least 31%, at least 32%, at least 33%, at least 34%, at least 35%.

As used herein, the term "solubility" refers to the mass of the solute dissolved when certain solid substances or a small amount of liquid substances reach saturation in 100 g of a solvent at a certain temperature, which is called the solubility of this substance in this solvent. The solubility of a substance is a physical property.

The external environment covered herein usually refers to at room temperature, for example, it may be 15° C. to 35° C., but other cases are not excluded. In a practical operation process, the temperature of one experiment will be changed depend on specific actual needs.

The disclosure also provides a method for preparing the precursor solution, which comprises the following steps:
(1) preparing an organic solvent contains nanobubbles;
(2) dissolving a solute in the organic solvent contains nanobubbles.

Specifically, the process of preparing the organic solvent containing nanobubbles may include treating the organic solvent for a certain period of time using at least one of the following: mechanical stirring, sonic vibration, electrolysis, atomization, hydrodynamic cavitation, optical cavitation and the like, the said means can be the one has been implemented in prior art, for example, the means described in the Chinese patent CN 210845927 U. Further, the time for treating the organic solvent by said method or these methods can be at least 1 second, at least 2 seconds, at least 3 seconds, at least 4 seconds, at least 5 seconds, at least 6 seconds, at least 7 seconds, at least 8 seconds, at least 9 seconds, at least 10 seconds, at least 11 seconds, at least 12 seconds, at least 13 seconds, at least 14 seconds, at least 15 seconds, at least 16 seconds, at least 17 seconds, at least 18 seconds, at least 19 seconds, at least 20 seconds, at least 21 seconds, at least 22 seconds, at least 23 seconds, at least 24 seconds, at least 25 seconds, at least 26 seconds, at least 27 seconds, at least 28 seconds, at least 29 seconds, at least 30 seconds, at least 31 seconds, at least 32 seconds, at least 33 seconds, at least 34 seconds, at least 35 seconds, at least 36 seconds, at least 37 seconds, at least 38 seconds, at least 39 seconds, at least 40 seconds, at least 41 seconds, at least 42 seconds, at least 43 seconds, at least 44 seconds, at least 45 seconds, at least 46 seconds, at least 47 seconds, at least 48 seconds, at least 49 seconds, at least 50 seconds, at least 51 seconds, at least 52 seconds, at least 53 seconds, at least 54 seconds, at least 55 seconds, at least 56 seconds, at least 57 seconds, at least 58 seconds, at least 59 seconds, at least 60 seconds, at least 2 minutes, at least 3 minutes, at least 4 minutes, at least 5 minutes, at least 6 minutes, at least 7 minutes, at least 8 minutes, at least 9 minutes, at least 10 minutes, at least 11 minutes, at least 12 minutes, at least 13 minutes, at least 14 minutes, at least 15 minutes, at least 16 minutes, at least 17 minutes, at least 18 minutes, at least 19 minutes, at least 20 minutes, at least 21 minutes, at least 22 minutes, at least 23 minutes, at least 24 minutes, at least 25 minutes, at least 26 minutes, at least 27 minutes, at least 28 minutes, at least 29 minutes, at least 30 minutes, at least 31 minutes, at least 32 minutes, at least 33 minutes, at least 34 minutes, at least 35 Minutes, at least 36 minutes, at least 37 minutes, at least 38 minutes, at least 39 minutes, at least 40 minutes, at least 41 minutes, at least 42 minutes, at least 43 minutes, at least 44 minutes, at least 45 minutes, at least 46 minutes, at least 47 minutes, at least 48 minutes, at least 49 minutes, at least 50 minutes, at least 51 minutes, at least 52 minutes, at least 53 minutes, at least 54 minutes, at least 55 minutes, at least 56 minutes, at least 57 minutes, at least 58 minutes, at least 59 minutes, at least 60 minutes, at least 2 hours, at least 3 hours, at least 4 hours, at least 5 hours, at least 6 hours, at least 7 hours, at least 8 hours, at least 9 hours, at least 10 hours, at least 11 hours, at least 12 hours, at least 13 hours, at least 14 hours, at least 15 hours, at least 16 hours, at least 17 hours, at least 18 hours, at least 19 hours, at least 20 hours, at least 21 hours, at least 22 hours, at least 23 hours, or at least 24 hours. As an exemplary embodiment, the time for treating the organic solvent by the or these methods may be in a range from 30 seconds to 1 hour, for example, from 1 minute to 60 minutes, from 1 minute to 55 minutes, from 1 minute to 50 minutes, from 1 minute to 45 minutes, from 1 minute to 40 minutes, from 1 minute to 35 minutes, from 1 minute to 30 minutes, from 2 minutes to 30 minutes, from 3 minutes to 30 minutes, from 4 minutes to 30 minutes, or from or 5 minutes to 30 minutes.

In various embodiments, the gas in the nanobubbles may be air, or a single component or several components in the air, or an inert gas, or the like. As an exemplary embodiment, the gas in the nanobubbles may include one or more of nitrogen ($N_2$), oxygen ($O_2$), carbon dioxide ($CO_2$), ozone ($O_3$), nitric oxide (NO), nitrogen dioxide ($NO_2$)), helium (He) gas, neon (Ne), argon (Ar) gas, krypton (Kr), xenon (Xe) gas, and radon (Rn) gas.

As an exemplary embodiment, the process of preparing nanobubbles in step (1) includes treating the organic solvent using at least one of the following: mechanical stirring, sonic vibration, electrolysis, atomization, hydrodynamic cavitation, optical cavitation, and the like, for example, using mechanical stirring, more specifically, using a high-speed rotating blade to stir the organic solvent(s).

Further, for example, the organic solvent can be placed in a container, and then the organic solvent can be stirred by a high-speed rotating blade to generate nanobubbles. Specifically, the speed of the blade rotation can be 10,000 to 100,000 rpm/min, preferably 20,000 to 100,000 rpm/min, preferably 30,000 to 100,000 rpm/min, preferably 40,000 to 100,000 rpm/min, preferably 50,000 to 100,000 rpm/min, preferably 60,000 to 100,000 rpm/min, preferably 70,000 to 100,000 rpm/min, preferably 80,000 to 100,000 rpm/min. Alternatively, the speed of blade rotation can be 10,000 to 90,000 rpm/min, 10,000 to 80,000 rpm/min, 10,000 to 70,000 rpm/min, 10,000 to 60,000 rpm/min, 10,000 to 50,000 rpm/min, or 10,000 to 40,000 rpm/min, for example, about 10,000 rpm/min, about 20,000 rpm/min, about 30,000 rpm/min, about 40,000 rpm/min, about 50,000 rpm/min, about 60,000 rpm/min, about 70,000 rpm/min, about 80,000 rpm/min, about 90,000 rpm/min, or about 100,000 rpm/min.

The disclosure also provides a perovskite absorption layer, the perovskite absorption layer includes an organic component and said precursor solution, wherein the organic component includes one of or a mixture of two or more of methyl ammonium iodide (MAI), methyl bromide (MABr), chloromethylammonium (MACl), formamidine hydroiodide (FAI), formamidine hydrobromide (FABr), and formamidine hydrochloride (FACl).

Alternatively, as an exemplary embodiment, the organic component is added to the precursor solution and then coated on the surface of a substrate to form a perovskite absorption layer.

Alternatively, as an exemplary embodiment, the precursor solution is coated on the surface of a substrate, and then the organic component is coated thereon to form a perovskite absorption layer.

The disclosure also provides a perovskite solar cell, the perovskite solar cell includes said perovskite absorption layer, a substrate, a carrier transport layer, and an electrode.

Preferably, the substrate is a transparent conductive substrate, such as an FTO (fluorine doped tin oxide) substrate and/or an ITO (indium tin oxide) substrate.

Further, the electrode is a metal electrode.

The disclosure increases the solubility and stability of metal halide (such as $PbI_2$) in the solvent by preparing an organic solvent with abundant nanobubbles, thereby improving the efficiency of the perovskite solar cell and increasing its reproducibility.

Traditional dissolution method relies on heating to dissolve metal halide. Taking $PbI_2$ as an example, the dissolved lead iodide is dissociated into $Pb^{2+}$ ions and $I^-$ ions in a solvent, while the solubility limit of $PbI_2$ in the solvent is confined due to some thermodynamic factors. When comparing with the traditional technique, the metal halide of the disclosure is dissolved in a solvent containing nanobubbles, and the dissociated metal halide ions are attracted by the charged nanobubbles to form an electrical double layer system, thereby reducing the ion concentrations in the main body of the solvent, and in turn further improving the solubility of metal halides (such as $PbI_2$).

As an exemplary embodiment, the stability and solubility of metal halides (such as $PbI_2$) are improved due to the presence of nanobubbles in the organic solvent(s), and the nanobubbles have a nano-scale particle size (for example, about 100 nm) and a low zeta potential (for example, about −40 mV), such that the nanobubbles can stably stay in the organic solvent(s).

As an exemplary embodiment, the process of dissolving lead iodide ($PbI_2$) is divided into two steps, as shown in FIG. 1. Dissolution process of $PbI_2$ crystals: $PbI_2$ in solid phase is firstly dissolved in an organic solution with abundant nanobubbles, existing in the solution in the form of $PbI_2$ particles, undissociated $PbI_2$ molecule (in a small amount), and dissociated $Pb^{2+}$ ions and $I^-$ ions. The process is the same as conventional dissolution process, only different in that an electric double layer is formed by combining the nanobubbles with inside positive charges and external negative charges with the $Pb^{2+}$ and I-ions dissolved in the solution, and a compact layer at and within the slipping plane of the electric double layer. The stern electric double layer accumulates a large number of $Pb^{2+}$ ions and $I^-$ ions, which are not freely movable, such that they will cause the dissolution balance to proceed further toward the right side, which means toward to continue the dissolution, thereby increasing the solubility of $PbI_2$. Moreover, due to unmovable of these ions accumulated around the nanobubbles, the stability of the precursor solution is improved.

As used herein, the term "stern electric double layer" means that some counter ions around the surface of a charged body (or a charged solid) closely cling to the surface of the charged body (or a charged solid) due to dual effects of electrostatic attraction and Van der Waals attraction. These ions and the solvent molecules bound on the surface of the charged body (or charged solid) together constitute the so-called Stern layer, and the rest of the counter ions are diffusely distributed outside the Stern layer to form a diffusion layer of the electric double layer. Among them, inside the Stern layer, the electrical center of the counter ions constitutes the so-called Stern plane. From the surface of the solid body to the Stern plane, the potential of the electric double layer goes a straight downhill, and the potential difference between the stern plane and the inside of the solution is called the Stern potential. In the electrokinetic phenomenon, the Stern layer moves together with the solid surface, and its outer periphery constitutes the slipping plane between two phases, and the potential difference between the slipping plane and the inside of the solution is called electrokinetic potential or $\xi$-potential.

The crystallization process of $PbI_2$ crystal: the precursor solution containing nanobubbles is subjected to a reverse process of dissolution. As the temperature rises, the solvent begins to volatilize, and the $Pb^{2+}$ ions and $I^-$ ions in the solution begin to separate out, and with the concentration decrease of $Pb^{2+}$ ions and $I^-$ ions, the $Pb^{2+}$ ions and $I^-$ ions around the nanobubbles begin to diffuse back into the solution, and finally complete the crystallization process, which can slow down the crystallization process and produce a higher efficiency. However, ordinary precursor solutions crystallize directly to form a $PbI_2$ film.

Usually, zeta potential of the precursor solution without adding nanobubbles is about −1 mV to −5 mV. At this Zeta potential, the particles or ions in the solution cannot exist stably, and acicular crystals or agglomerates of acicular crystals are easily formed. This performance is very unfavorable for industrially manufacturing perovskite solar cells. As an exemplary embodiment, the zeta potential of the precursor solution after adding nanobubbles can be changed to, for example, a range from −45 mV to −50 mV, and at this potential, the particles or ions in the solution can stably exist for 1 to 4 weeks (for example, about 1 week, about 2 weeks, about 3 weeks, about 4 weeks, optionally from 1 to 2 weeks, or from 1 to 3 weeks). By adding nanobubbles, not only does the composition of the precursor solution not need to be changed, but the stability of the precursor solution can be greatly increased. Secondly, due to the presence of nanobubbles, the solubility of $PbI_2$ in the solution can be increased by about 30%. In addition, the increase of the solubility of $PbI_2$ can further increase the thickness of the perovskite layer, thereby increasing the efficiency of the perovskite solar cell.

Not for a special limitation, but for illustrative purposes only, the zeta potential of a pure solvent without nanobubbles can be about 10 mV, and the zeta potential of a pure solvent containing nanobubbles can be about −70 mV, the zeta potential of the precursor solution without nanobubbles may be about −1 mV, and the zeta potential of the precursor solution containing nanobubbles may be about −45 mV.

Further, as an exemplary embodiment, in the precursor solution under a potential of −90 mV to −20 mV, the particles or ions described in this disclosure can exist stably for about 7 days, about 8 days, about 9 days, about 10 days, about 11 days, about 12 days, about 13 days, about 14 days, and about 15 days, about 16 days, about 17 days, about 18 days, about 19 days, about 20 days, about 21 days, about 22 days, about 23 days, about 24 days, about 25 days, about 26 days, about 27 days, about 28 days, about 29 days, about 30 days, or even a longer period.

The precursor solution of a perovskite material absorption layer by conventional preparation method is unstable, especially after being exposed to a humid environment or being irradiated by light or ultraviolet light, for example, the solution may be prone to agglomeration and precipitate $PbI_2$ crystals immediately or after being placed for 1-2 days, which will subsequently cause poor uniformity of the absorption layer structure of the perovskite solar cell, thereby resulting in poor reproducibility and low conversion efficiency of the perovskite solar cell.

In an exemplary embodiment of the disclosure, the precursor solution with nanobubbles can slowly release $Pb^{2+}$ ions and $I^-$ ions inside the slipping plane when producing the $PbI_2$ crystal layer, such that the $PbI_2$ layer will be more smooth, thereby the efficiency of the perovskite solar cells can be improved.

Unless otherwise specified herein, the purity grades of the substances purchased or used herein are chemically pure, analytically pure or superior-grade pure, preferably analytically pure, and more preferably superior-grade pure.

As used herein, "and/or" includes any and all combinations of one or more of the associated listed items. The terms used herein are only intended to describe specific embodiments, and are not intended to limit the present disclosure. As used herein, the singular forms "a", "an" are also intended to include the plural forms, unless the context clearly dictates otherwise. It is further understood that "include", "including", "comprise", "comprising" or "contain", "containing" when used in the specification specifies the stated feature, integer, step, operation, element, component and/or composition, but does not exclude the presence or addition of one or more other feature(s), integer(s), step(s), operation(s), element(s), component(s), composition(s) and/or combinations thereof.

Unless otherwise defined, all terms (including scientific and technical terms) used herein have equal meaning that those skilled in the art to which the present disclosure pertains generally understand. It is further understood that terms, such as those defined in commonly used dictionaries, are interpreted in accordance with their meaning in the context of the relevant field, and are not idealized or overly formal, unless explicitly defined as such herein.

Unless otherwise indicated herein or clearly contradicted by the context, all methods described herein can be performed in any suitable order.

Unless otherwise indicated, the use of any and all examples or exemplary language (such as "for example") provided herein is only intended to better clarify the disclosure, and does not limit the scope of the disclosure. Unless explicitly stated, the language in the specification should not be interpreted as indicating that any element is indispensable for implementing the disclosure.

The exemplary invention described herein may appropriately lack any one or more element limitations, which is not specifically disclosed herein. Therefore, the terms "include", "including", "comprise", "comprising", "contain", "containing" and the like should be understood broadly but not limited. In addition, the term expression(s) used herein is used for description without limitation, and the use of these term expressions that do not include any equivalent characteristics is unintentional, but only describes some of their characteristics, but according to appended claims, various modifications are possible within the scope of the disclosure. Therefore, although the disclosure has been specifically disclosed through preferred embodiments and optional features, modifications of the disclosure disclosed herein to embody changes in the disclosure may be recorded by those skilled in the art, and such modifications and changes will be considered as falling within the scope of the disclosure.

When comparing with the prior art, the disclosure has the following technical advantages:

(1) The precursor solution of the disclosure has a very low zeta potential, nanobubbles can exist stably in the organic solvent(s) for up to one month, and dissolving metal halides in the organic solvent(s) containing nanobubbles can effectively increase the stability of metal halides in the solvent(s);

(2) When comparing with traditional methods for preparing the precursor solution of perovskite cells, the method for preparing the precursor solution of the disclosure can effectively improve the stability, reproducibility and solubility of the metal halide in the organic solvent(s);

(3) The perovskite solar cell prepared by the disclosure has higher efficiency and excellent reproducibility;

(4) Current large-scale commercial production and application of perovskite solar cells are immature, but the disclosure provides great possibilities for the commercial production and application of perovskite solar cells.

DETAILED DESCRIPTION OF PREFERRED EMBODIMENTS

In order to better illustrate the disclosure, a further description will be made with the following specific embodiments, but the disclosure is not limited to the specific embodiments.

Example 1

Preparing Precursor Solution:

(1) Preparing organic solvents containing nano-bubbles: introducing air gas (0.1 L/min) into a closed container, which has a volume of 1 L and filled with 200 ml of solution (which is DMF: DMSO in a volume ratio of 4:1), and then producing nanobubbles by a high-speed rotating blade (30000 rpm/min). The particle size of the nanobubble is about 100 nm, and the rotation time of the blade is recorded as 0, 5, 10, 20 min;

(2) Preparing precursor solution containing nanobubbles: adding $PbI_2$ into the DMF: DMSO mixed solvent containing nanobubbles, then heating and stirring for 10 minutes at 70° C. to dissolve the $PbI_2$ particles, and naturally cooling the mixture to room temperature. The zeta potential of the mixed solvent without nanobubbles (which means the rotation time of the blade is 0 min) is about 10 mV, while the zeta potential of the mixed solvent containing nanobubbles is about −50 to −70 mV.

The solubility of $PbI_2$ in each group was measured, and the results are listed in Table 1.

TABLE 1

The solubility of $PbI_2$ changes with the time when the nanobubbles are generated

| Time for nano-bubbling | $PbI_2$ Solubility (g/g) | Increase of the solubility (%) |
|---|---|---|
| 0 min | 0.58 | — |
| 5 min | 0.75 | 29.20 |
| 10 min | 0.73 | 25.49 |
| 20 min | 0.68 | 17.43 |

It can be seen from Table 1 that with the generation of nanobubbles, the solubility of $PbI_2$ is rapidly increased to 29.20%, and then as continuously nano-bubbling, but the solubility of $PbI_2$ is slowly reduced to 17.43%.

In addition, the strength CPS (count per second) of a pure solvent and the precursor solution containing nanobubbles was also studied. The results of the count rate are listed in Table 2.

TABLE 2

The strength CPS of a pure solvent and the precursor
solution containing nanobubbles under different
times (0, 5, 10, 20 min) for nano-bubbling

| Solvent | Count rate (kcps) | Precursor solution containing nanobubbles | Count rate (kcps) |
|---|---|---|---|
| 0 min | 15.4 | 0 min | 112.4 |
| 5 min | 183 | 5 min | 244.9 |
| 10 min | 317.2 | 10 min | 502.5 |
| 20 min | 158 | 20 min | 205.3 |

Example 2

The optical microscope photos, zeta potential, and particle size distribution of the precursor solutions prepared in Example 1 were measured after being placed for different time (Day 0, Day 1, Day 7, Day 14).

Figure 1:
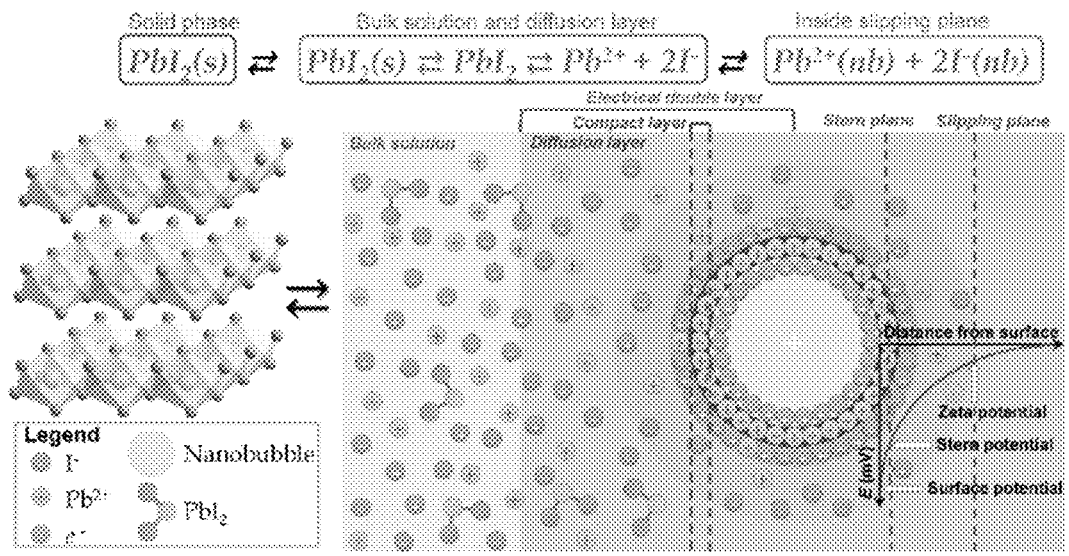
FIG. 1 is a schematic diagram of the dissolution and crystallization process of lead iodide ($PbI_2$) in a nanobubble solution.
Figure 2:
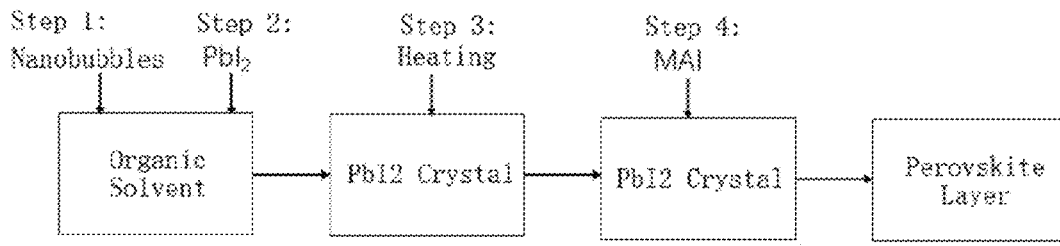
FIG. 2 is a schematic flow chart of the first preparation route of the perovskite absorption layer according to the disclosure.
Figure 3:
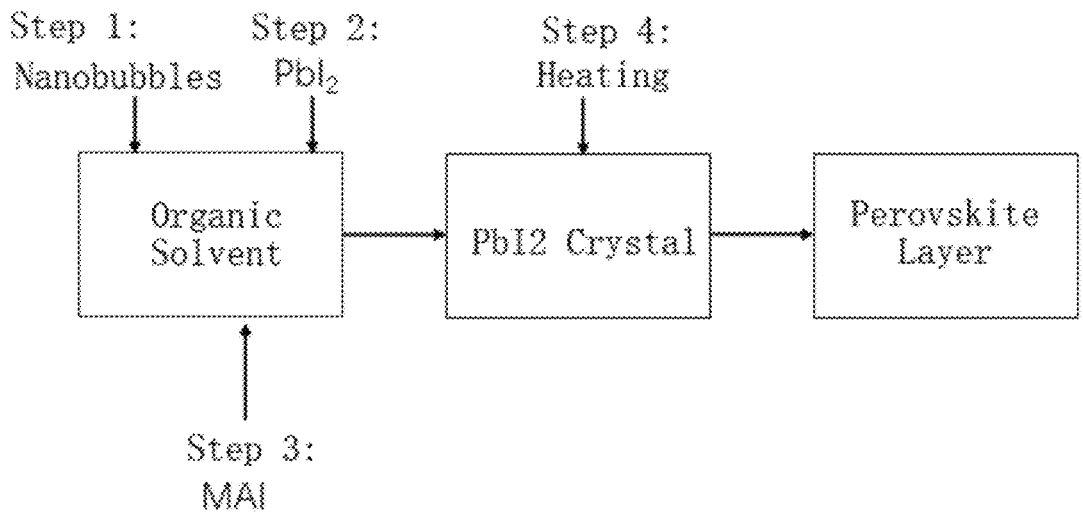
FIG. 3 is a schematic flow chart of the second preparation route of the perovskite absorption layer according to the disclosure.

FIG. 3 shows the optical microscope photos, zeta potential, and particle size distribution images of the precursor solution without nanobubbles (which means the the nano-bubbling duration is 0 min) and with abundant nanobubbles after being placed for 2 weeks, respectively. FIG. 3 shows the influence of the addition or generation of nanobubbles on the precursor solution. As can be seen from FIG. 3, common precursor solutions (which means the the nano-bubbling duration is 0 min) began to agglomerate after 1 day of formulation, and larger agglomerations were observed after one week, and numerous larger agglomerations were observed in only two weeks later. In addition, the solution after nano-bubbling (that is, the the nano-bubbling duration is 5 min, 10 min, and 20 min) has a lower zeta potential, which can facilitate the solution to remain stable for a long period, and the particle size of the nanobubbles in the solution began to increase after one week, which indicated that crystallization began to appear after a week. These fully demonstrates that the stability of the precursor solution with abundant nanobubbles is significantly better.

Example 3

The precursor solutions of Example 2 after being placed for different times (Day 0, Day 1, Day 7, Day 14) were produced into perovskite solar cell absorber layers and perovskite solar cells.

First, rinsing an FTO glass with deionized water, acetone, and ethanol respectively, and then oxidizing it with oxygen and others for 10 minutes to remove any organic substance on outer surface. Then, taking 60 ml of nickel acetylacetonate dissolved in acetonitrile solution and spraying it evenly on the FTO glass and heating to 570° C. to form a NiO layer of 20 nm thick; spraying 1 mol/L of lead iodide precursor solution on the NiO layer in a similar manner to form a $PbI_2$ layer, and then the glass panel was immersed in 1 mol/L MAI solution to form a perovskite absorption layer, and calcined at 110° C. for 15 minutes. Subsequently, 30 mg/ml of PCBM (a fullerene derivative) solution (which is PCBM dissolved in chlorobenzene solution) was spin-coated on the calcined perovskite layer for 30 s at a rotation speed of 1500 rpm/min, and then the chlorobenzene solution was removed by vacuum evaporation (lower than $2*10^{-5}$ pa), and finally a layer of 100 nm thick of silver was deposited by vacuum evaporation (lower than $2*10^{-5}$ pa).

Figure 4:
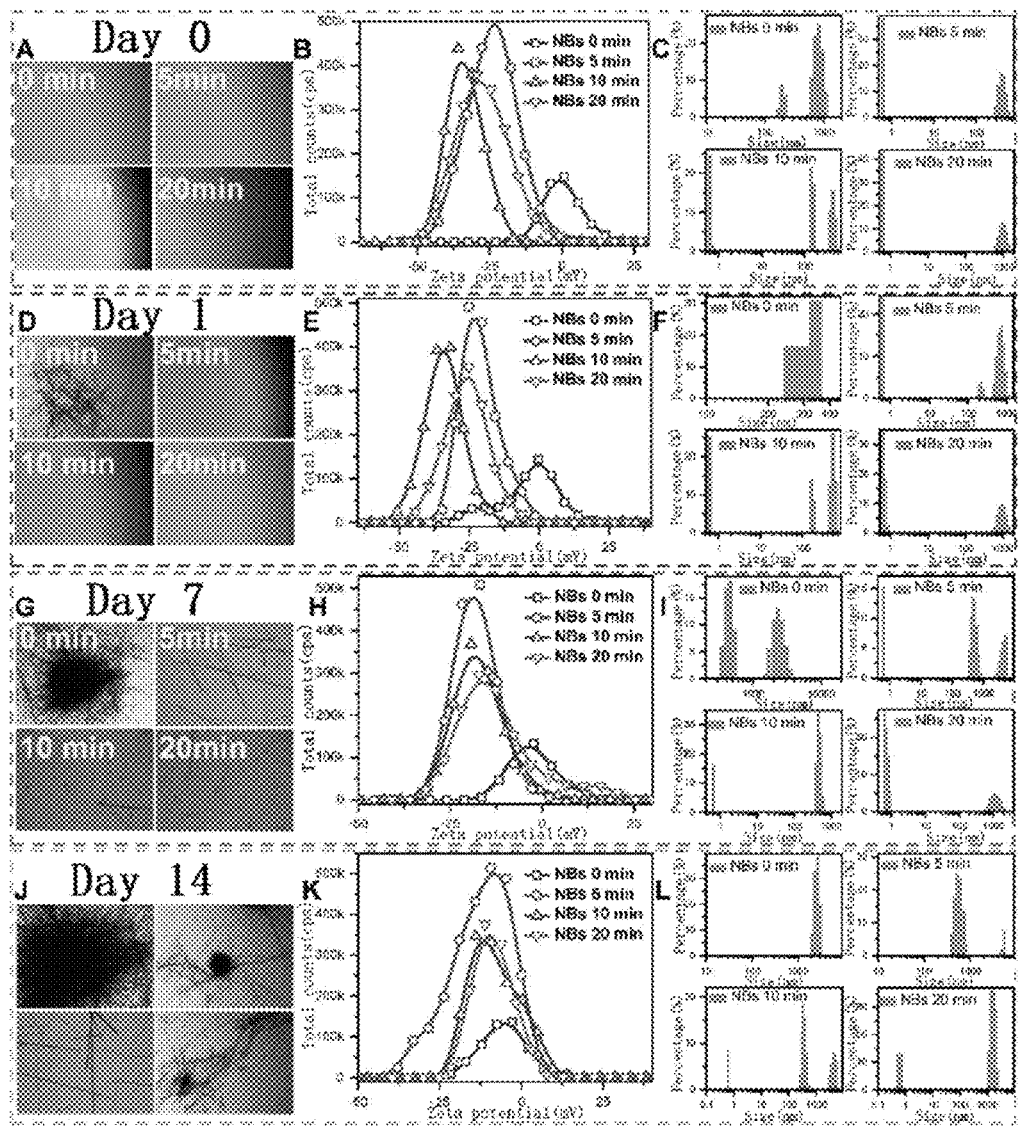
FIG. 4 shows optical microscope photos, zeta potential and particle size distribution images of the precursor solution, which has been placed for 2 weeks, without nanobubbles and with abundant nanobubbles.
Figure 5:
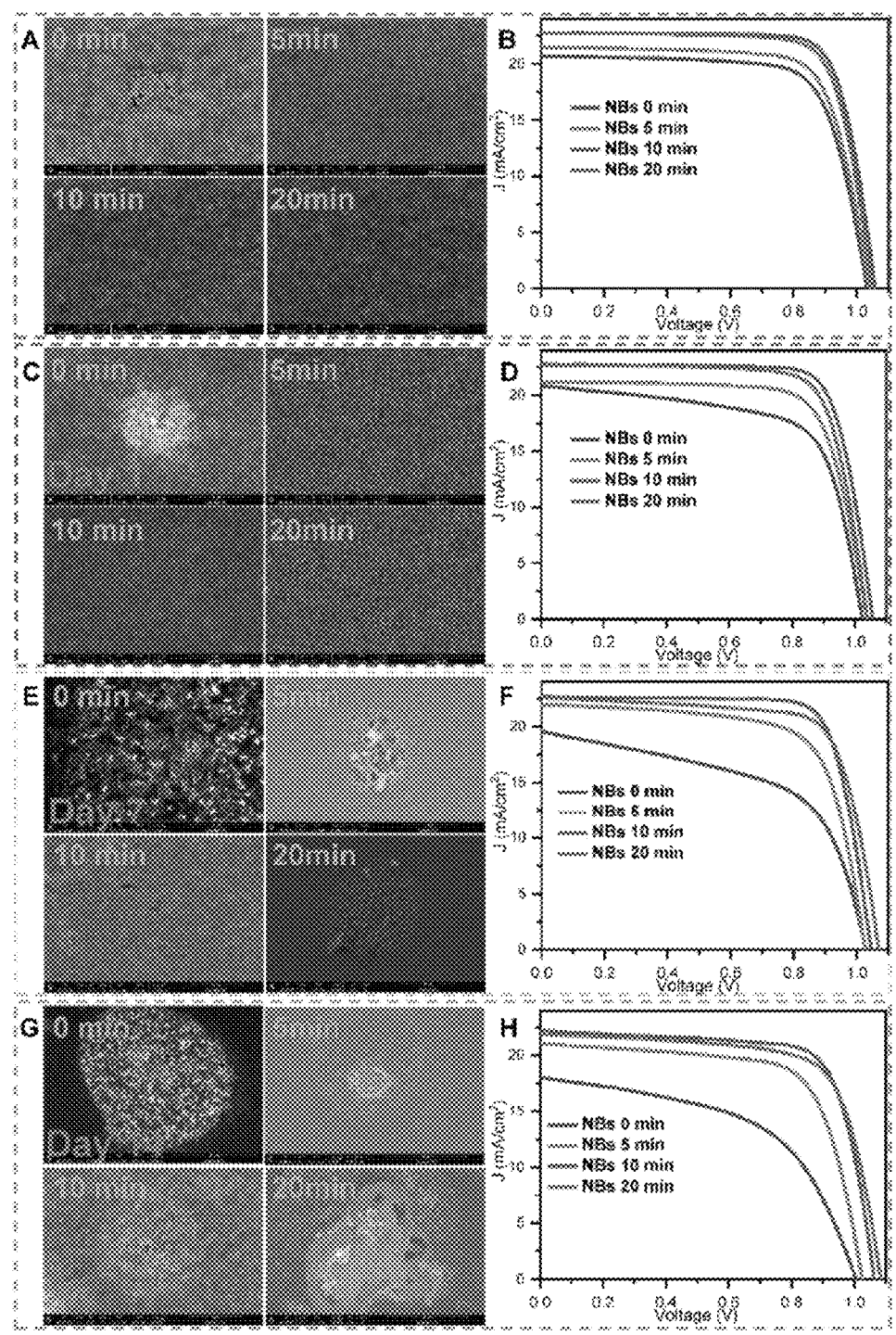
FIG. 5 shows the SEM photographs of the synthesized lead iodide crystal layer and the efficiency test of corresponding perovskite solar device.

As can be seen from FIG. 4, even the absorber layer of the perovskite solar cell was prepared by a newly prepared common precursor solution (which means the nano-bubbling duration is 0 min), there still were some crystal defects caused by large particles with a diameter of about 1 μm, and large agglomerated dendrites began to appear after being placed for one day. The appearance of this crystallization will greatly affect the efficiency of the perovskite solar cell, and because of its uncontrollable appearance, the reproducibility of the perovskite solar cell is poor. With the extension of storage, larger acicular crystals began to appear, and a large number of acicular crystals appeared at Day 14. Moreover, the size of the $PbI_2$ nanoparticles prepared by said common precursor solution (which means the the nano-bubbling duration is 0 min) is about 345 nm. FIG. 5 shows the SEM photographs of the synthesized lead iodide crystal layer and the efficiency test of corresponding perovskite solar device. In B, D, F, H of FIG. 5, NBs 0 min represents nano-bubbling for 0 min, which corresponds to the lowest line (the curve with the smallest ordinate); NBs 10 min represents nano-bubbling for 10 min, corresponds to the highest line (the curve with the largest ordinate); NBs 5 min represents nano-bubbling for 5 min, which corresponds to the third highest line (the curve with the third largest ordinate); NBs 20 min represents nano-bubbling for 20 min, which corresponds to the second-highest line (the curve with the second-largest ordinate). As can be seen from the scanning electron microscope photos of the precursor solution with abundant nanobubbles (which means the nano-bubbling duration (also called NB or NBs) is 5 min, 10 min, and 20 min), the absorption layer of the perovskite solar cell prepared by said precursor solution is very uniform, and only sporadic defects can be observed in the solution after seven days, until two weeks later, the defects having a bit larger area can be observed in accompany with a small amount of acicular crystals. Moreover, the particle size of the absorber layer in the perovskite solar cell prepared by the solution containing nanobubbles is about 145 nm, which is much smaller than that prepared by a common precursor solution (which means the nano-bubbling duration is 0 min). In addition, the efficiency of the perovskite solar cells prepared by the solutions containing nanobubbles is much higher than that prepared by the solutions without nanobubbles. And as the storage time extends, the efficiency difference increases, wherein the efficiency difference is about 7% in two weeks later (which means the the nano-bubbling duration is 10 min, the efficiency is 17.44%, while no nano-bubbling, the efficiency is only 9.52%).

Figure 6:
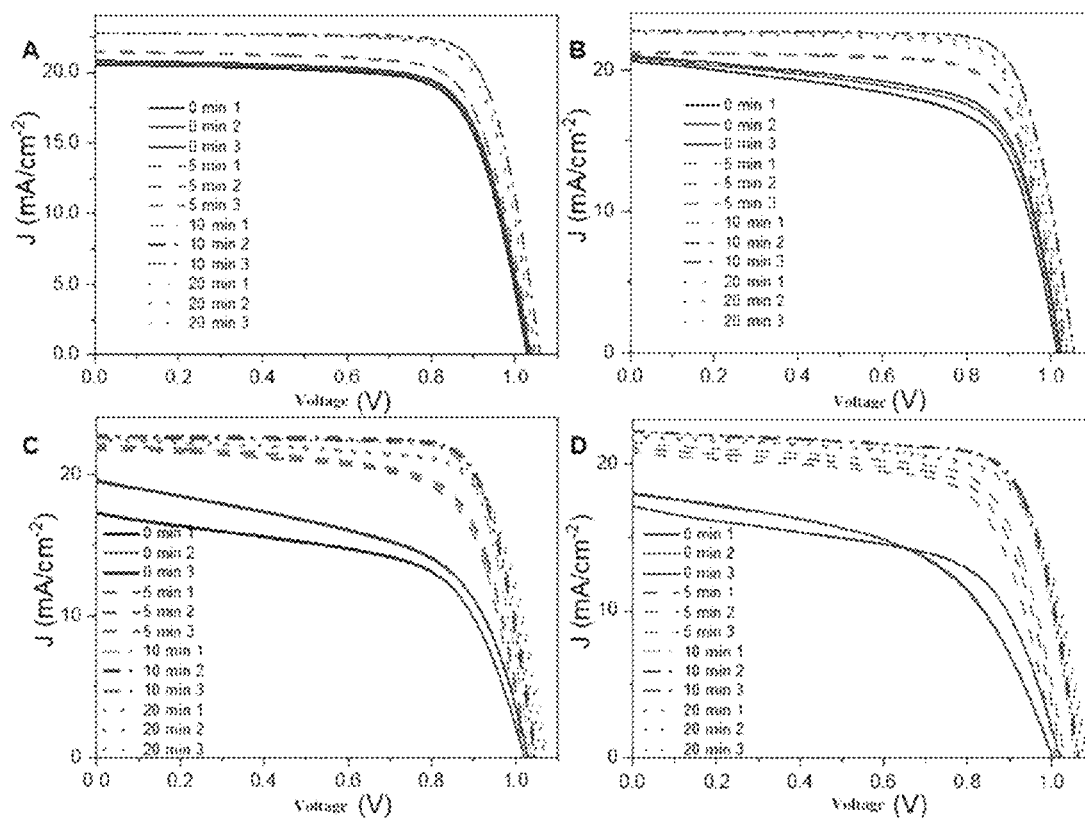
FIG. 6 shows efficiency and stability tests of the perovskite solar cells prepared by the precursor solutions with different aging times and different nano-bubbling durations.

In addition, the reproducibility of the perovskite solar cell prepared by the disclosure was also tested, and the results demonstrated that the reproducibility was very good, as shown in FIG. 6. Further, the efficiency and stability of the perovskite solar cells prepared by the precursor solutions with different aging times and different nano-bubbling durations were also studied. The aging time in FIG. 6 is 0, 1, 7, 14 days respectively, and experiments of each group repeated three times. The curve finally obtained is a voltage current curve of the perovskite solar cell. As can be seen from this curve, we can know the open circuit voltage (Voc), short circuit current (Jsc), fill factor (FF) and photoelectric conversion efficiency (n) of the perovskite device under different preparation conditions and aging times. Table 3 lists the performance parameters of the three repeated experiments and the variances corresponding to them. It can be seen that with the generation of nanobubbles, the devices of the perovskite solar cell have been significantly improved, and with the extension of the aging time, the stabilities of the devices have also been significantly improved (the efficiency slowly drops). Moreover, under the same aging times, the variance of corresponding performance parameters of the group containing nanobubbles are smaller, which demonstrated that the perovskite solar cell devices prepared by the method of the disclosure have better reproducibility.

TABLE 3

Performances of the perovskite solar cells prepared by the precursor solutions with different aging times and different nano-bubbling durations

| Aging time of the precursor solution | Nano-bubbling | Jsc(mA/cm$^2$) | Voc (mV) | FF (%) | η (%) |
|---|---|---|---|---|---|
| Day 0 | 0 min | 20.68 ± 0.17 | 1031.7 ± 3.55 | 73.1 ± 0.045 | 15.6 ± 0.19 |
| | 5 min | 21.47 ± 0.05 | 1039.8 ± 0.23 | 74.3 ± 0.01 | 16.6 ± 0.04 |
| | 10 min | 22.80 ± 0.02 | 1058.0 ± 0.40 | 78.1 ± 0.075 | 18.8 ± 0 |
| | 20 min | 22.78 ± 0.03 | 1047.9 ± 0.60 | 76.8 ± 0.053 | 18.3 ± 0.023 |
| 1 Day | 0 min | 20.82 ± 0.19 | 1020.3 ± 5.17 | 66.3 ± 1.58 | 14.1 ± 0.54 |
| | 5 min | 21.21 ± 0.09 | 1036.1 ± 3.10 | 74.4 ± 0.21 | 16.4 ± 0.066 |
| | 10 min | 22.79 ± 0.02 | 1054.5 ± 1.50 | 78.1 ± 0.02 | 18.8 ± 0.032 |
| | 20 min | 22.67 ± 0.12 | 1037.4 ± 5.49 | 76.3 ± 0.13 | 17.9 ± 0.22 |
| Week 1 | 0 min | 18.88 ± 1.25 | 1025.9 ± 7.43 | 56.8 ± 1.82 | 11.0 ± 0.45 |
| | 5 min | 21.92 ± 0.16 | 1024.8 ± 6.95 | 69.7 ± 0.17 | 15.7 ± 0.23 |
| | 10 min | 22.65 ± 0.00 | 1044.1 ± 4.43 | 78.0 ± 0.11 | 18.4 ± 0.23 |
| | 20 min | 22.53 ± 0.10 | 1068.1 ± 4.99 | 73.5 ± 0.24 | 17.7 ± 0.13 |
| 2 weeks | 0 min | 17.82 ± 0.43 | 1009.8 ± 10.31 | 54.5 ± 3.26 | 9.8 ± 0.43 |
| | 5 min | 21.19 ± 0.32 | 1022.2 ± 9.75 | 68.8 ± 0.91 | 14.9 ± 0.57 |
| | 10 min | 22.27 ± 0.04 | 1062.2 ± 4.35 | 73.7 ± 0.11 | 17.4 ± 0.13 |
| | 20 min | 21.91 ± 0.08 | 1082.8 ± 4.67 | 70.7 ± 0.19 | 16.8 ± 0.17 |

Example 4

Preparing Precursor Solution:
(1) Preparing organic solvents containing nano-bubbles: introducing air gas (0.1 L/min) into a closed container, which has a volume of 1 L and filled with 200 ml of solution (the solvent is acetone), and then producing nanobubbles by a high-speed rotating blade (50000 rpm/min). The particle size of the nanobubble is about 100 nm, and the rotation time of the blade is recorded as 0, 5, 10, 20 min;
(2) Preparing precursor solution containing nanobubbles: adding SnCl$_2$ into the acetone solvent containing nanobubbles, then heating and stirring for 8 min at 75° C. to dissolve SnCl$_2$, and naturally cooling the mixture to room temperature. The rotation time of the blade in the group not containing nanobubbles is 0 min, while the rotation time of the blade in the group containing nanobubbles is 5, 10, and 20 min, respectively.

The solubility of SnCl$_2$ in each group was measured, and the results are listed in Table 4.

TABLE 4

The solubility of SnCl$_2$ changes with the duration for nano-bubbling

| Duration for nano-bubbling | SnCl$_2$ Solubility (g/g) | Increase of the solubility (%) |
|---|---|---|
| 0 min | 0.56 | — |
| 5 min | 0.68 | 21.43 |
| 10 min | 0.78 | 39.29 |
| 20 min | 0.72 | 28.57 |

It can be seen from Table 4 that with the generation of nanobubbles, the solubility of SnCl$_2$ is rapidly increased to 21.43%, and then as continuously nano-bubbling, the solubility of SnCl$_2$ is continually increased to 39.29% at 10 min, but subsequently with continuous nano-bubbling, the solubility of SnCl$_2$ is slowly decreased to 28.57% at 20 min.

In addition, the lead iodide can be replaced with tin iodide, indium iodide, silver iodide, antimony iodide or bismuth iodide, or SnCl$_2$ can be replaced with indium chloride or antimony chloride, and DMF: DMSO can be replaced with acetone or acetonitrile or dimethyl sulfoxide, similar results as Examples 1 and 4 can be observed in all these alternative embodiments.

The precursor solution of Example 4 was prepared into a perovskite solar cell absorber layer and a perovskite solar cell. The results showed that the reproducibility and other performances of the obtained perovskite solar cells were excellent.

The above are only specific embodiments of the disclosure, and are not therefore intended to limit the scope of the disclosure. Any equivalent transformations made by the disclosure, or directly or indirectly applied to other related technical fields, are included within the claimed scope of the disclosure.

For specific conditions that are not indicated in the examples, it shall be carried out in accordance with conventional conditions or the conditions recommended by the manufacturer. The reagents or instruments used without the manufacturer are all conventional products that can be purchased commercially.

The invention claimed is:

1. A precursor solution, wherein the solute of the precursor solution comprises a metal halide, the solvent of the precursor solution is an organic solvent, and the precursor solution contains nanobubbles, wherein the diameter of the nanobubbles is not more than 1000 nm, and the zeta potential of the precursor solution is not more than −20 mV.

2. The precursor solution of claim 1, wherein the metal halide comprises at least one of lead halide, tin halide, indium halide, silver halide, antimony halide, bismuth halide, lithium halide, beryllium halide, sodium halide, magnesium halide, aluminum halide, potassium halide, calcium halide, scandium halide, titanium halide, vanadium halide, chromium halide, manganese halide, iron halide, cobalt halide, nickel halide, copper halide, zinc halide, gallium halide, germanium halide, rubidium halide, strontium halide, yttrium halide, zirconium halide, niobium halide, molybdenum halide, technetium halide, ruthenium halide, rhodium halide, palladium halide, cadmium halide, cesium halide, barium halide, lanthanide halide, hafnium halide, tantalum halide, tungsten halide, rhenium halide, osmium halide, iridium halide, platinum halide, gold halide, mercury halide, thallium halide, polonium halide, and actinium halide.

3. The precursor solution of claim 1, wherein the organic solvent comprises at least one of an aromatic hydrocarbon-based organic solvent, an aliphatic hydrocarbon-based organic solvent, an alicyclic hydrocarbon-based organic solvent, a halogenated hydrocarbon-based organic solvent, an alcohol-based organic solvent, an ether-based organic solvent, an ester-based organic solvents, a ketone-based organic solvent, a pyridine-based organic solvent, a phenol-based organic solvent, a nitrile-based organic solvent, and a sulfone-based organic solvent.

4. The precursor solution of claim 1, wherein the solubility of the solute in the organic solvent containing nanobubbles is higher than that of without nanobubbles.

5. A method for preparing the precursor solution of claim 1, which comprising the following steps:
   (1) preparing an organic solvent contains nanobubbles;
   (2) dissolving a solute into the organic solvent contains nanobubbles.

6. The method of claim 5, wherein the process of preparing nanobubbles in step (1) comprises treating the organic solvent using at least one of the following: mechanical stirring, sonic vibration, electrolysis, atomization, hydrodynamic cavitation, optical cavitation, and the like.

7. A perovskite absorption layer, wherein the perovskite absorption layer comprises an organic component and a precursor solution of claim 1, wherein the organic component includes at least one of methyl ammonium iodide, methyl bromide, chloromethylammonium, formamidine hydroiodide, formamidine hydrobromide, and formamidine hydrochloride.

8. The perovskite absorption layer of claim 7, wherein the organic component is added to the precursor solution and then coated on the surface of a substrate to form a perovskite absorption layer.

9. The perovskite absorption layer of claim 7, wherein the precursor solution is coated on the surface of a substrate, and then the organic component is coated thereon to form a perovskite absorption layer.

10. A perovskite solar cell, wherein the perovskite solar cell comprises the perovskite absorption layer of claim 7, a substrate, a carrier transport layer, and an electrode.

* * * * *

UNITED STATES PATENT AND TRADEMARK OFFICE
CERTIFICATE OF CORRECTION

PATENT NO. : 12,213,330 B2
APPLICATION NO. : 17/630356
DATED : January 28, 2025
INVENTOR(S) : Gu et al.

Page 1 of 1

It is certified that error appears in the above-identified patent and that said Letters Patent is hereby corrected as shown below:

In the Specification

Column 7, Line 14: Please correct "I-ions" to read --I⁻ ions--

Column 12, Line 58: Please correct "(n)" to read --(η)--

Signed and Sealed this
Fifteenth Day of July, 2025

Coke Morgan Stewart
*Acting Director of the United States Patent and Trademark Office*